(12) United States Patent
Wu et al.

(10) Patent No.: US 11,315,768 B2
(45) Date of Patent: Apr. 26, 2022

(54) LOADING APPARATUS AND PHYSICAL VAPOR DEPOSITION APPARATUS

(71) Applicant: BEIJING NAURA MICROELECTRONICS EQUIPMENT CO., LTD., Beijing (CN)

(72) Inventors: Xuewei Wu, Beijing (CN); Tong Wang, Beijing (CN); Boyu Dong, Beijing (CN); Jun Zhang, Beijing (CN); Bingliang Guo, Beijing (CN); Jun Wang, Beijing (CN); Henan Zhang, Beijing (CN); Baogang Xu, Beijing (CN); Huaichao Ma, Beijing (CN); Shaohui Liu, Beijing (CN); Kangning Zhao, Beijing (CN); Yujie Geng, Beijing (CN); Qingxuan Wang, Beijing (CN); Yaxin Cui, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 27 days.

(21) Appl. No.: 16/626,863

(22) PCT Filed: Jun. 15, 2018

(86) PCT No.: PCT/CN2018/091643
§ 371 (c)(1),
(2) Date: Dec. 26, 2019

(87) PCT Pub. No.: WO2019/001298
PCT Pub. Date: Jan. 3, 2019

(65) Prior Publication Data
US 2020/0144035 A1 May 7, 2020

(30) Foreign Application Priority Data
Jun. 30, 2017 (CN) .......................... 201710554503.7

(51) Int. Cl.
*H01J 37/32* (2006.01)
*C23C 14/35* (2006.01)
(Continued)

(52) U.S. Cl.
CPC ........ *H01J 37/32715* (2013.01); *C23C 14/35* (2013.01); *C23C 14/50* (2013.01);
(Continued)

(58) Field of Classification Search
None
See application file for complete search history.

(56) References Cited

U.S. PATENT DOCUMENTS 5,552,124 A * 9/1996 Su ..................... C23C 16/4401
156/345.1
5,942,042 A * 8/1999 Gogh ...................... H01L 21/67
118/728
(Continued)

FOREIGN PATENT DOCUMENTS

CN 201089791 Y 7/2008
CN 102007572 A 4/2011
(Continued)

OTHER PUBLICATIONS

World Intellectual Property Organization (WIPO) International Search Report for PCT/CN2018/091643 dated Aug. 23, 2018 7 Pages.

*Primary Examiner* — Jason Berman
(74) *Attorney, Agent, or Firm* — Anova Law Group, PLLC

(57) ABSTRACT

The present disclosure provides a loading apparatus and a physical vapor deposition (PVD) apparatus. The loading apparatus includes a pedestal configured to support a work-
(Continued)

piece; and a first support member placed on the pedestal and configured to push up a cover ring when the pedestal is at an operation position to prevent an overlapping portion of a cover ring and the workpiece from contacting each other. In the loading apparatus and the PVD apparatus, the first support member supports the cover ring, such that the cover ring does not contact the workpiece, thereby reducing stress forces on the workpiece by external components.

18 Claims, 6 Drawing Sheets

(51) Int. Cl.
　　*C23C 14/50*　　　(2006.01)
　　*H01J 37/34*　　　(2006.01)
(52) U.S. Cl.
　　CPC ...... *H01J 37/3405* (2013.01); *H01J 37/3426* (2013.01); *H01J 2237/332* (2013.01)

(56) References Cited

U.S. PATENT DOCUMENTS

| | | | | |
|---|---|---|---|---|
| 6,284,093 | B1* | 9/2001 | Ke | .................... H01J 37/32623 |
| | | | | 156/345.51 |
| 2009/0260982 | A1* | 10/2009 | Riker | .................. H01J 37/3441 |
| | | | | 204/298.11 |
| 2013/0001215 | A1* | 1/2013 | Chang | ............... H01L 21/67103 |
| | | | | 219/391 |

FOREIGN PATENT DOCUMENTS

| | | |
|---|---|---|
| CN | 104241184 A | 12/2014 |
| CN | 104862660 A | 8/2015 |
| CN | 107227448 A | 10/2017 |
| CN | 207072968 U | 3/2018 |
| JP | H08186074 A | 7/1996 |

\* cited by examiner

LOADING APPARATUS AND PHYSICAL VAPOR DEPOSITION APPARATUS

CROSS-REFERENCES TO RELATED APPLICATIONS

This application is a national phase entry under 35 U.S.C. § 371 of International Application No. PCT/CN2018/091643, filed on Jun. 15, 2018, which claims the priority to Chinese Patent Application No. 201710554503.7, filed on Jun. 30, 2017, the entire contents of which are incorporated herein by reference.

FIELD OF THE DISCLOSURE

The present disclosure relates to a loading apparatus and a physical vapor deposition apparatus including the loading apparatus.

BACKGROUND

Physical vapor deposition (PVD) is a technology of physically vaporizing a surface of a material source (solid or liquid) into gaseous atoms, molecules or partially ionized ions under a vacuum condition and passing a low-pressure gas (or plasma) process to deposit a thin film with a special function on a surface of a substrate. The PVD process primarily includes a vacuum evaporation process, a sputtering coating process, an arc plasma plating process, an ion plating process, and a molecule beam epitaxy process. Currently, the PVD process can not only deposit a metal film and an alloy film, but also can deposit a compound film, a ceramic film, a semiconductor film, and a polymer film, etc.

The performance of a PVD apparatus directly affects quality and production yield of deposited films. As the requirements for precision, quality, and production yield of the films of various devices become more stringent, there is a continued drive for improvements in the performance of the PVD apparatus.

BRIEF SUMMARY OF THE DISCLOSURE

The objective of the present disclosure is to solve one or more technical problems in the existing technology. The present disclosure provides a loading apparatus and a physical vapor deposition (PVD) apparatus including the loading apparatus.

One aspect of the present disclosure provides a loading apparatus. The loading apparatus includes: a pedestal configured to support a workpiece; and a first support member placed on the pedestal and configured to push up a cover ring when the pedestal is at an operation position to prevent overlapping portion of a cover ring and the workpiece from contacting each other.

Optionally, the first support member is an annular-shaped structure annularly placed on a surface of the pedestal.

Optionally, the annular-shaped structure includes at least one avoidance opening to allow a workpiece transferring mechanism to pass through; and the workpiece is placed on the pedestal by the workpiece transferring mechanism.

Optionally, the first support member includes a plurality of first support sub-members evenly distributed along a circumference of the pedestal; and each of the plurality of first support sub-members pushes up the cover ring when the pedestal is at the operation position.

Optionally, the first support member further includes an extension portion extending from an inner surface of the first support member to the center of the pedestal until overlapping with the workpiece; and when the pedestal is at the operation position, in an axial direction of the pedestal, an upper surface of the extension portion at least overlapping with the workpiece is lower than a lower surface of the workpiece or directly contacts with the lower surface of the workpiece.

Optionally, in a radial direction of the pedestal, a gap is formed between at least the portion of the first support member at least located above the extension portion and the workpiece.

Optionally, in the axial direction of the pedestal, a first gap is formed between the lower surface of the workpiece and the extension portion; and a ratio of a radial length of an orthogonal projection of the first gap on the pedestal over a height of the first gap is greater than 5.

Optionally, in the axial direction of the pedestal, a second gap is formed between an upper surface of the workpiece and the cover ring; and a ratio of a radial length of an orthogonal projection of the second gap on the pedestal over a height of the second gap is greater than 5.

Optionally, the pedestal includes: a support surface disposed with the first support member; and a second support member placed on the support surface and configured to support the workpiece.

Optionally, in the axial direction of the pedestal, a height of the first support member is greater than a height of the second support member.

Optionally, the second support member includes a plurality of second support sub-members; and at least one of the plurality of second support sub-members is a thermocouple.

Another aspect of the present disclosure provides a physical vapor deposition (PVD) apparatus. The PVD apparatus includes: a chamber including a bottom wall, a top wall disposed opposite to the bottom wall, and a side wall disposed between the top wall and the bottom wall and coupled with the top wall and the bottom wall; and the disclosed loading apparatus, disposed between the bottom wall and the top wall and including the first support member disposed opposite to the top wall.

Optionally, the PVD apparatus further includes a shield. The shield surrounds at least a portion of the side wall of the chamber and is coupled with the side wall of the chamber. When the pedestal is at a detached position, the shield supports the cover ring.

The loading apparatus and the PVD apparatus including the loading apparatus provided by the embodiments of the present disclosure reduce the stress forces on the workpiece by external components. The workpiece is only subject to a gravitational force and a support force by a support column to balance the gravitational force. In addition, because the workpiece does not contact the cover ring, the bonding that is likely to occur between the workpiece and the cover ring is avoided, thereby reducing the chances that the workpiece breaks, or the workpiece is placed at an uncertain or undesired position. In addition, the plasma is effectively prevented from passing through the workpiece and being sputtered onto the upper surface of the pedestal.

BRIEF DESCRIPTION OF THE DRAWINGS

In order to more clearly illustrate the technical solutions in the embodiments of the present disclosure, drawings used in the description of the embodiments will be briefly described below. The drawings in the following description are only some embodiments of the present disclosure. Other drawings may also be obtained by those of ordinary skill in the art without inventive work.

DETAILED DESCRIPTION

To make the objectives, technical solutions, and advantages of the present disclosure clearer, the following further describes the embodiments of the present disclosure in details with reference to the accompanying drawings. It should be understood by those skilled in the art that the foregoing are merely certain preferred embodiments of the present disclosure and are not intended to limit the present disclosure. Without departing from the spirit and principles of the present disclosure, any modifications, equivalent substitutions, and improvements, etc. shall fall within the scope of the present disclosure.

Unless otherwise defined, technical terms or scientific terms used in the present disclosure are intended to be understood in ordinary meanings by those having ordinary skills in the art. The words "first", "second", and similar terms used in the present disclosure do not denote any order, quantity, or importance, but are used to distinguish different components. The words "including" or "comprising", and similar terms mean that a component or an object preceding the word is intended to encompass components or objects, and the equivalents thereof succeeding the word, and do not exclude other components or objects.

Figure 1A:
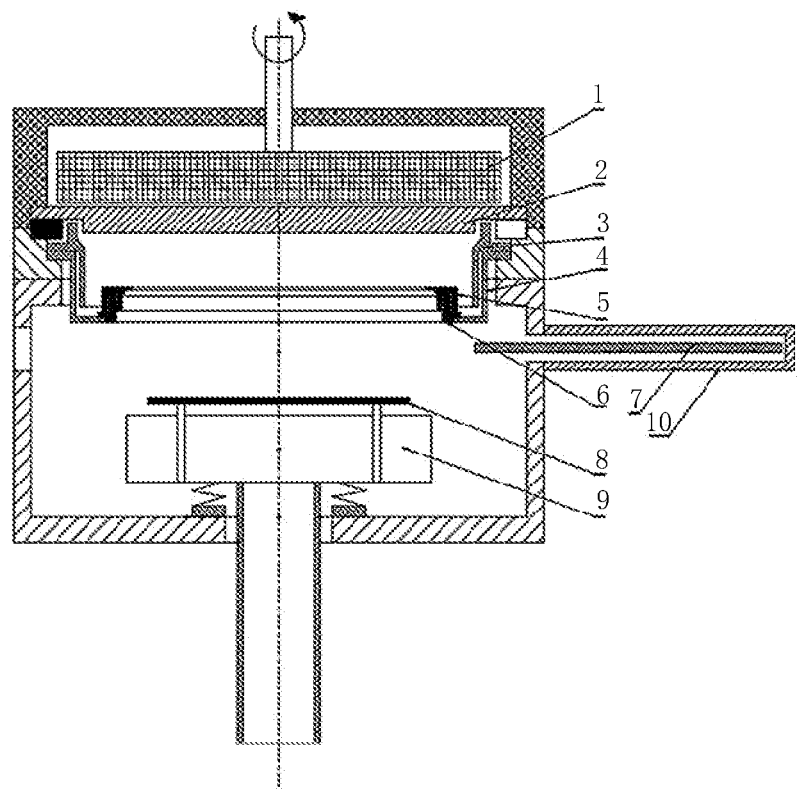
FIG. 1A illustrates a cross-sectional view of an exemplary physical vapor deposition (PVD) apparatus.

FIG. 1A illustrates a cross-sectional view of an exemplary physical vapor deposition (PVD) apparatus (e.g., a magnetron sputtering apparatus). As shown in FIG. 1A, the magnetron sputtering apparatus includes a magnetron 1, an aluminum target 2, and deionized water filled between the magnetron 1 and the aluminum target 2 for cooling the aluminum target 2. During the sputtering process, a pulsed direct current (DC) power supply supplies a negative voltage to the aluminum target 2. In addition, the PVD apparatus also includes an upper shield 3, a lower shield 4, a cover ring 5, a thermal insulation ring 6, a shutter 7, a shutter storage chamber 10, and a pedestal 9. A workpiece 8 is held by a support column of the pedestal 9. When the apparatus is used for a thin film deposition process, the workpiece 8 is first heated at a high temperature. The shutter 7 is moved into a chamber disposed between the target 2 and the workpiece 8. Then, the shutter 7 is moved out to formally perform a process of depositing the thin film. Before formally performing the deposition process, the pedestal 9 ascends with the workpiece 8 to a position where it can contact the cover ring 5 disposed on the thermal insulation ring 6. Then, the pedestal 9 continues to ascend to a certain height, such that the peripheral portion of the workpiece 8 pushes up the cover ring 5 and separates the cover ring 5 from the thermal insulation ring 6. An annular region of the upper surface of the workpiece 8 contacts with the cover ring 5, thereby enclosing a space by the target, the shield, the cover ring, and the workpiece 8. A plasma is formed in this space, and a formed aluminum nitride (AlN) film is deposited on an upper surface of a substrate of the workpiece 8. The cover ring and the shield serve to form a relatively sealed reaction environment and to prevent the depositing matter from contaminating inner walls of the chamber. After the formal deposition process is completed, the pedestal 9 descends with the workpiece 8 and the cover ring 5 until the cover ring 5 is pushed against and held by the thermal insulation ring 6. Then, the pedestal 8 continues to descend with the workpiece 8 to a transfer position, a workpiece transfer action is performed. The process of depositing the thin film on the substrate is completed.

Figure 1B:
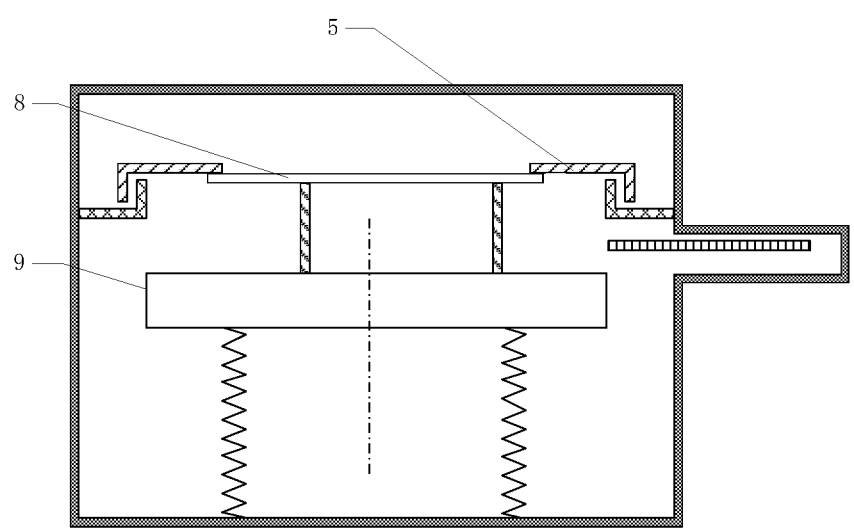
FIG. 1B illustrates a simplified cross-sectional view of the exemplary PVD apparatus in FIG. 1A.

FIG. 1B illustrates a simplified cross-sectional view of the exemplary PVD apparatus in FIG. 1A, which highlights a position relationship between the support column of the pedestal 9, the workpiece 8, and the cover ring 5 when the workpiece 8 pushes up the cover ring 5. As shown in FIG. 1B, the workpiece 8 is held by the support column of the pedestal 9, and the peripheral portion of the workpiece 8 pushes up the cover ring 5.

For this structure, the workpiece 8 is pushed up by three pins and supported by three support points. The workpiece 8 is raised to push up the cover ring 5. To obtain a faster heating rate, the thinner a thickness of the workpiece 8 is, the faster the workpiece 8 is heated to a higher temperature. However, if the workpiece 8 is overly thin, the workpiece 8 is likely to be broken due to a large internal stress caused by a downward pressing force of the cover ring 5 and an upward pushing force of the three pins. For example, the PVD process for depositing the aluminum nitride (AlN) is often performed in a high-temperature high-vacuum chamber. In the event of the broken workpiece, the chamber needs to be exposed to the normal air environment for internal cleaning and then the vacuum needs to be restored. A special process needs to be performed to prepare the chamber to restore the high-temperature high-vacuum environment. The process wastes a lot of time.

After the repeated sputtering processes of the AlN PVD on the workpiece and the cover ring, a certain thickness of aluminum or aluminum nitride thin film is deposited on the surface (during the process, the target is cleaned, and a certain amount of the aluminum is deposited). At the substantially high temperature of the process, the aluminum on the upper surface of the workpiece and the aluminum on the cover ring may be bonded together. After the process is completed and when the pedestal descends, it is likely that the workpiece and the cover ring are bonded together. That is, the workpiece is not lowered along with the three pins and the pedestal. When such bonding occurs, and the cover ring and the workpiece are bonded together, no subsequent process can be performed. The chamber needs to be cooled, flushed, and opened to restore the chamber for further processing. During the descending of the pedestal, the workpiece may fall onto the three pins on the pedestal before the chamber is opened for retrieving the bonded workpiece. The falling workpiece may be broken by the impact hitting the three pins or the relative position between the workpiece and the pedestal may be shifted. In either case, the high-temperature high-vacuum chamber needs to be opened. As such, because the surfaces of the cover ring and the workpiece are deposited with the aluminum and the aluminum nitride during the process, the workpiece may be bonded together with the cover ring, thereby degrading the stability of the apparatus.

In one embodiment, the present disclosure provides a loading apparatus. For example, the loading apparatus may be used in the PVD apparatus for holding the workpiece and the cover ring. The loading apparatus includes a pedestal for holding the workpiece and a first support member placed on the pedestal for pushing up the cover ring when the pedestal is raised to the operation position to prevent the overlapping portion of the cover ring and the workpiece from contacting each other. Thus, the workpiece is prevented from breaking when being pushed against the cover ring. Because the cover ring does not directly contact the workpiece, the workpiece and the cover ring are prevented from being bonded together by the deposited material. In addition, the present disclosure also provides a PVD apparatus including the loading apparatus.

Further details are described below in accordance with some embodiments of the present disclosure. In the embodiments of the present disclosure, the workpiece may be, for example, a tray for holding a chip to be deposited, an individual chip to be deposited, or a combined structure that the chip is attached to the tray, which is not limited by the present disclosure.

Embodiment One

The present embodiment provides a loading apparatus. For example, the loading apparatus may be installed in a chamber of a PVD apparatus for holding a workpiece. In addition, the loading apparatus coordinates with a lifting mechanism to move inside the chamber of the PVD apparatus and supports a cover ring in the PVD apparatus.

Figure 2:
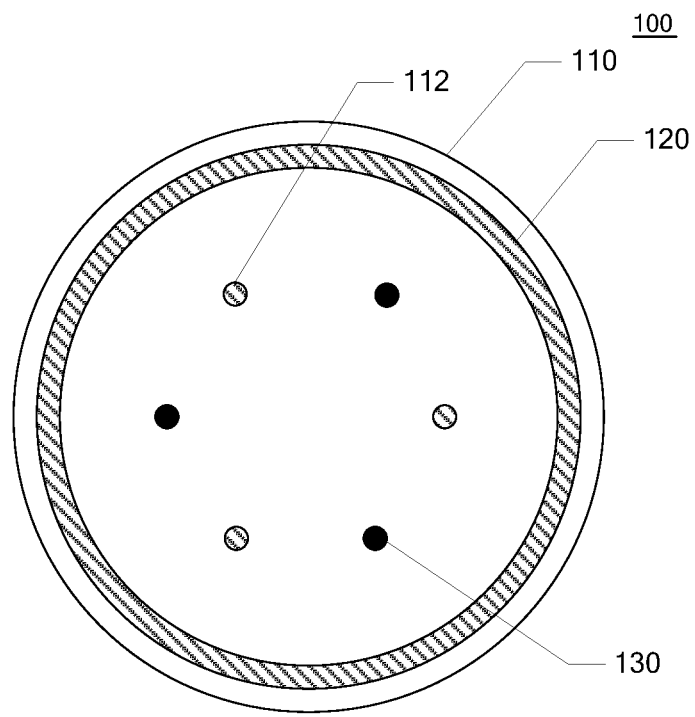
FIG. 2 illustrates a top view of an exemplary loading apparatus according to some embodiments of the present disclosure.
Figure 3A:
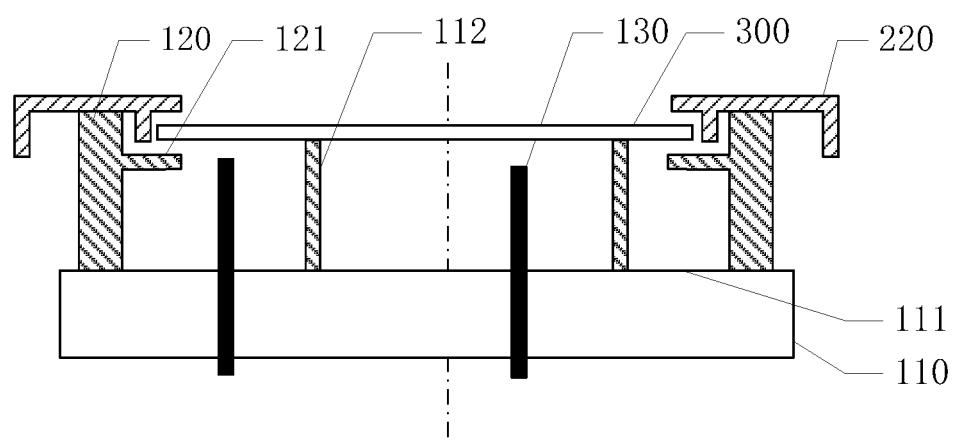
FIG. 3A illustrates a cross-sectional view of an exemplary loading apparatus according to some embodiments of the present disclosure.

Referring to FIG. 2 and FIG. 3A, the loading apparatus 100 includes a pedestal 110 and a first support member 120. The pedestal 110 is configured to hold a workpiece 300. The first support member 120 is placed on the pedestal 110 for pushing up a cover ring 220 when the pedestal 110 is at an operation position to prevent an overlapping portion of the cover ring 220 and the workpiece 300 from contacting each other.

It should be noted that an end of the first support member 120 adjacent to the pedestal 110 may be disposed on an upper surface of the pedestal 110 (the top surface of the pedestal 110 as shown in FIG. 3A) or may be disposed on side surfaces of the pedestal (the left side surface and the right side surface of the pedestal as shown in FIG. 3A).

In one embodiment, as shown in FIG. 2, the first support member 120 is an annular-shaped structure annularly placed on the surface of the pedestal 110. For example, the first support member 120 may be a ring-shaped structure. In this case, the entire circumference of the first support member 120 may be used to support the cover ring 220 to effect a stable support. For illustrative purposes, the ring-shaped structure is shown in FIG. 2. However, the first support member 120 may be any annular-shaped structure suitable for supporting the cover ring 220.

Figure 4:
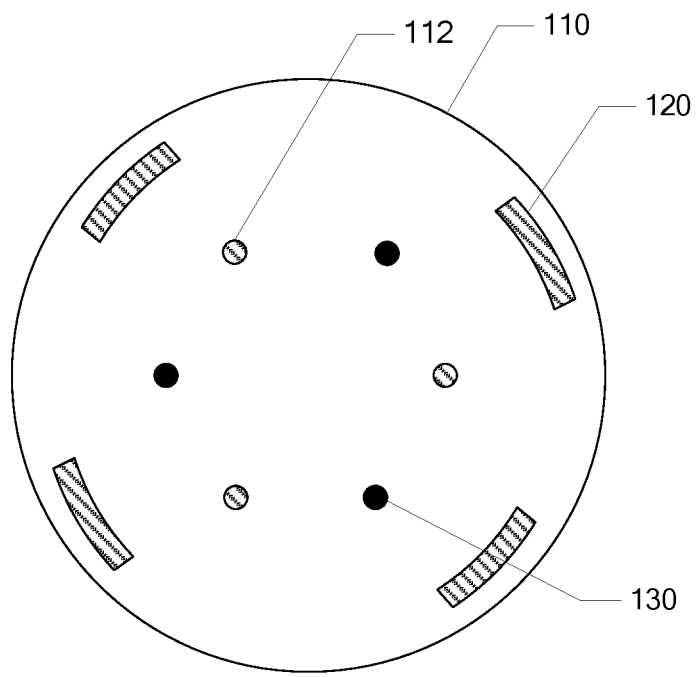
FIG. 4 illustrates a top view of another exemplary loading apparatus according to some embodiments of the present disclosure.

In addition, in one embodiment, the first support member 120 is not limited to be the annular-shaped structure. FIG. 4 illustrates a top view of another exemplary loading apparatus according to some embodiments of the present disclosure. As shown in FIG. 4, the first support member 120 may include a plurality of first support sub-members. The plurality of first support sub-members is evenly distributed along a circumferential direction of the pedestal 110. Each of the plurality of first support sub-members is configured to push up the cover ring 220 when the pedestal 110 is at the operation position. For example, as shown in FIG. 4, the first support member 120 may include four first support sub-members evenly distributed along the circumferential direction of the pedestal (e.g., equally spaced). However, the number of the first support sub-members and the distribution pattern thereof are not limited by the embodiments of the present disclosure as long as the plurality of first support sub-members can stably support the cover ring 220.

In one embodiment, as shown in FIG. 3A, the first support member 120 includes an extension portion 121. The extension portion 121 extends from an inner surface of the first support member 120 to the center of the pedestal 110 until overlapping with the workpiece 300. At the operation position, in the axial direction of the pedestal 110, an upper surface of the extension portion 121 at least overlapping with the workpiece 300 is lower than a lower surface of the workpiece 300.

Figure 3B:
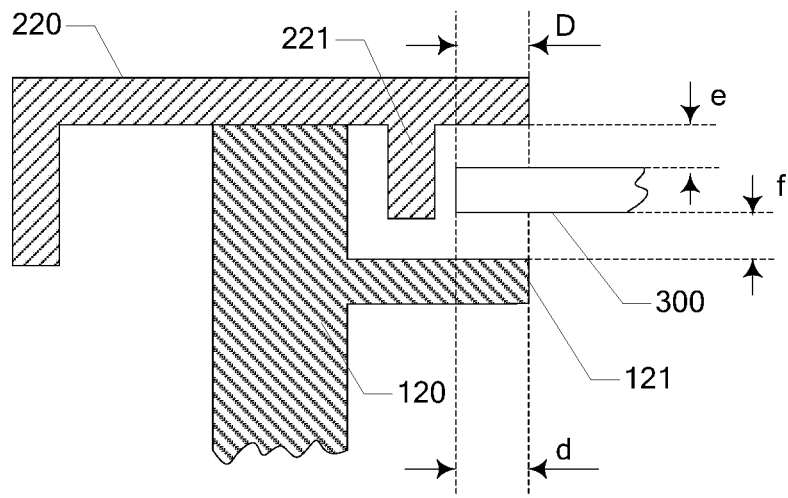
FIG. 3B illustrates an enlarged partial cross-sectional view of the exemplary loading apparatus according to some embodiments of the present disclosure.

As shown in FIG. 3A, at the operation position, at least a portion of the extension portion coincides with an orthogonal projection of the workpiece 300 on the pedestal 110. In one example, the projection of a peripheral portion of the workpiece 300 overlaps with at least a portion of the upper surface of the extension portion 121. In another example, if the first support member 120 is the annular-shaped structure, an inner diameter of the first support member 120 is smaller than an outer diameter of the workpiece 300. In this case, the upper surface of the extension portion 121 and the lower surface of the workpiece 300 together form a first gap in between. FIG. 3B illustrates an enlarged partial cross-sectional view of the exemplary loading apparatus in FIG. 3A. As shown in FIG. 3B, the size of the first gap in a direction parallel with the pedestal 110 from the outer side to the inner side of the first support member 120 is d (i.e., a radial length of the orthogonal projection of the first gap on the pedestal 110). The size of the first gap in the axial direction of the pedestal 110 is f (i.e., a height of the first gap). In some embodiments, a ratio of d over f (d/f) is greater than 5. For example, the size of the first gap in the height direction is 1 mm or less, and the size of the first gap in the radial direction is 6 mm or more. However, the present disclosure is not limited by the example. The gap satisfying the ratio relationship prevents the plasma from passing through. The related technical effects will be described in more detail below together with the embodiments of the PVD apparatus.

In one embodiment, as shown in FIG. 3A, in the radial direction of the pedestal 110, a gap is formed between at least a portion of the first support member 120 above the extension portion 121 and the workpiece 300. That is, as shown in FIG. 3A, the portion of the first support member 120 above the extension portion 121 is located beyond the outer side of the workpiece 300, thereby not affecting the stable support of the workpiece 300 by the pedestal 110.

Though not shown in the drawings, in some embodiments, at the operation position, the upper surface of the extension portion 121 may directly contact the workpiece 300. That is, when the pedestal 110 is raised to the operation position, the lower surface of the workpiece 300 may just contact the upper surface of the extension portion 121.

In one embodiment, the extension portion 121 may not overlap with the peripheral portion of the workpiece 300. That is, the extension portion 121 does not extend directly below the workpiece 300. In this case, no gap is formed between the extension portion 121 and the workpiece 300 to block the plasma. However, the plasma may be blocked by other means, which will be described in detail below. For example, in this case, if the first support member 120 is the annular-shaped structure, the inner diameter of the first support member 120 may be greater than the outer diameter of the workpiece 300.

For example, as shown in FIG. 3B, at least a portion adjacent to the inner side of the cover ring 220 (the portion adjacent to the center of the workpiece 300 or the center of the pedestal 110) overlaps with the orthogonal projection of the workpiece 300 on the pedestal 110. That is, the inner diameter of the cover ring 220 is smaller than the outer diameter of the workpiece 300. In the axial direction of the pedestal 110, the lower surface of the portion adjacent to the inner side of the cover ring 220 and the upper side of the workpiece 300 face toward each other to form a second gap. The radial length of the orthogonal projection of the second gap on the pedestal 110 is D. The size of the second gap (the height of the second gap) in the axial direction of the pedestal 110 is e. In one example, D and e satisfy the relationship: $D/e>5$. In another example, the size of the second gap in the height direction is 1 mm or less, and the size of the second gap in the radial direction is 6 mm or more. However, the present disclosure is not limited by the example.

As shown in FIG. 3B, in the periphery of the workpiece 300, there are two gaps blocking the plasma from passing through include the first gap between the lower surface of the workpiece 300 and the extension portion 121 of the first support member 120 and the second gap between the upper surface of the workpiece 300 and the lower surface of the cover ring 220. In this case, a sum of the ratios of the radial lengths of the orthogonal projections of the two gaps on the pedestal 110 over the heights of the two gaps respectively should be greater than 5. In the embodiment shown in FIG. 3B, the sum of the two ratios is $D/e+d/f=6/1+6/1=12$.

In addition, as shown in FIG. 3B, on the outer side of the workpiece 300, a protrusion portion 221 may be disposed on the lower surface of the cover ring 220. The protrusion portion 221 and the workpiece 300 may also form a gap, thereby more effectively blocking the plasma.

In one embodiment, as shown in FIG. 3A, the pedestal 110 includes a support surface 111 and a second support member 112. The first support member 120 is placed on the support surface 111. The second support member 112 is also placed on the support surface 111. The second support member 112 is configured to support the workpiece 300.

It should be noted that the orthogonal projection on the pedestal 110 can be the orthogonal projection on the support surface 111.

In one embodiment, as shown in FIG. 3A, in the axial direction of the pedestal 110, the height of the first support member 120 is greater than the height of the second support member 112. For example, the height difference between the first support member 120 and the second support member 112 may be greater than the thickness of the workpiece 300 supported by the second support member 112. In this case, a top end of the first support member 120 is higher than the upper surface of the of the workpiece 300. Thus, in an ascending process of the loading apparatus 100 in the PVD apparatus, the first support member 120 contacts the cover ring 220 first, thereby preventing the workpiece 300 from contacting the cover ring 220.

In the cross-sectional structure shown in FIG. 3A, the top end of the first support member 120 is higher than a top end of the second support member 112. However, this is not limited by the present disclosure. As long as the cover ring 220 does not contact the workpiece 300 supported by the second support member 112 when the cover ring 220 contacts with the first support member 120, the top end of the first support member 120 may be configured to be at any height. For example, in some embodiments, the cover ring 220 includes a protrusion portion facing downward to the top end of the first support member 120. At this point, the top end of the first support member 120 may be lower than the top end of the second support member 112 and the cover ring 220 is prevented from contacting the workpiece 300. Thus, the height of the first support member 120 may be greater than, equal to, or smaller than the height of the second support member 112.

The second support member 112 may be a column-shaped structure or may be any support structure suitable for supporting the workpiece 300. For example, in the top views of FIG. 2 and FIG. 4, the second support member 112 includes three equally spaced second support sub-members. In the cross-sectional view of FIG. 3A, for the convenience of illustration, only two second support sub-members are shown. However, the quantity and the shape of the second support sub-member are not limited to the embodiments shown in the drawings. For example, the second support member 112 may include more than three second support sub-members.

For example, at least one of the plurality of second support sub-members for supporting the workpiece 300 may be a thermocouple. The structure may be used to measure a temperature of the workpiece 300 in real time.

In addition, as shown in FIGS. 2-4, the loading apparatus also includes a liftable support pin 130. For example, the liftable support pin 130 moves upward in the axial direction of the pedestal. The top end of the liftable support pin 130 (the end located at the support surface 111 side of the pedestal 110) may reach a position more distant from the support surface 111 than the top end of the second support member 112. That is, the top end of the support pin 130 may reach above the top end of the second support member 112. Thus, the support pin 130 may be used to receive the workpiece 300 transferred by a robotic arm. For example, the top end of the support pin 130 may move above the top end of the second support member 112 to receive the workpiece 300 transferred by the robotic arm. Then, the support pin 130 descends until the top end of the support pin 130 is lower than the top end of the second support member 112, such that the workpiece 300 is placed on the second support member 112. The structure is merely one example of placing the workpiece 300 on the second support member 112. The embodiments of the present disclosure are not limited to this example. The workpiece 300 may be transferred by other means, without using the liftable support pin 130.

For example, in the top views of FIG. 2 and FIG. 4, one or more support pins 130 are disposed in a central region of the support surface and alternately separated by the second support member 112. Though FIG. 2 and FIG. 4 illustrate three support pins 130, the embodiments of the present disclosure are not limited by the drawings. As long as the workpiece 300 is stably supported, there may be more than three support pins 130. Further, the present disclosure does not limit a driving mechanism of the support pin 130. For example, the driving mechanism of the support pin 130 may be disposed inside the pedestal or in any other suitable position.

Figure 5:
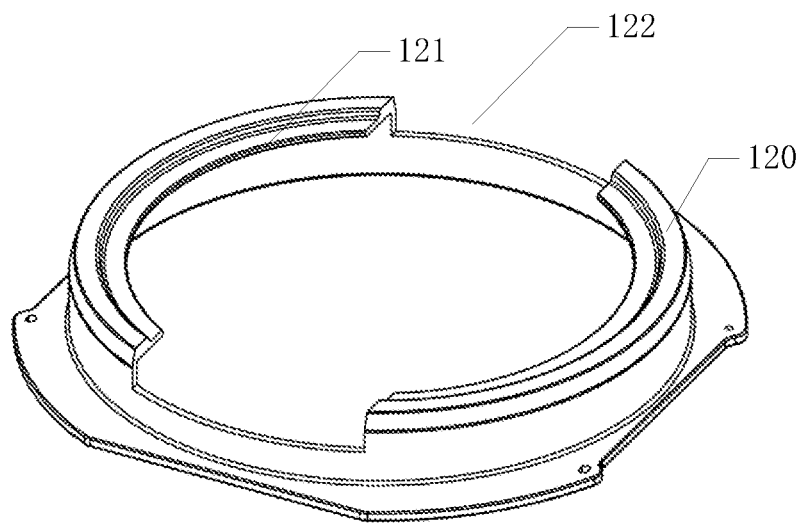
FIG. 5 illustrates a three-dimensional view of a first support member according to some embodiments of the present disclosure.

In some embodiments, the liftable support pin 130 may be used to receive the transferred workpiece 300. However, the embodiments of the present disclosure are not limited by the example, and the liftable support pin 130 may be removed. In one embodiment, the ascending of the liftable support pin 130 to a relatively high position first to receive the transferred workpiece 300 avoids interfering with movement of the robotic arm by the structures such as the support members. FIG. 5 illustrates a three-dimensional view of a first support member according to some embodiments of the present disclosure. As shown in FIG. 5, an avoidance opening 122 for a receiving mechanism (the robotic arm) to pass through is disposed on the top end of the annular-shaped first support member 120 (the end far away from the support surface when being placed on the pedestal). For example, at the avoidance opening 122, the top end edge of the first support member 120 is lower than the top end of the second support member 112 supporting the workpiece 300. That is, a distance between the top end edge of the first support member 120 at the avoidance opening 122 and the support surface of the pedestal is smaller than a distance between the top end edge of the portion of the first support member 120 other than the avoidance opening 122 and the support surface of the pedestal. As such, when the workpiece 300 is transferred, the robotic arm operated in a vacuum enters one avoidance opening to place the workpiece on the second support member 112 of the pedestal. Then, the robotic arm moves away from the above of heating pedestal and exits another avoidance opening, thereby achieving automatic workpiece transfer in the vacuum in absence of the liftable support pin.

In addition, at the two avoidance openings at this time, the lower portion of the workpiece periphery is unable to form a gap to effectively block the plasma. However, a ratio of a total effective width of a gap over a height of the gap formed between the upper surface of the workpiece periphery and the cover ring is large enough to effectively prevent the deposition material from sputtering onto the upper surface of the pedestal.

In one embodiment, the two avoidance openings are illustrated in FIG. 5. The embodiments of the present disclosure are not limited by the illustration. One avoidance opening for the robotic arm transferring the workpiece to pass through is sufficient. In some embodiments, there are three or more avoidance openings. In addition, because the gap formed between the upper surface of the workpiece periphery and the cover ring has already effectively blocked the plasma, the first support member may not be the annular-shaped structure. Instead, the first support member may include a plurality of individual first support sub-members (as shown in FIG. 4).

In addition, the disclosed loading apparatus may also include other suitable components or assemblies as desired. For example, structures as such a heating mechanism, a measuring mechanism, or various circuits may be disposed inside or above the pedestal, which are not limited by the present disclosure.

Embodiment Two

The present disclosure provides a PVD apparatus. For example, the PVD apparatus may be a sputtering apparatus, a magnetron sputtering apparatus, or an arc plasma deposition apparatus, etc. The PVD apparatus includes any loading apparatus described in the embodiments of the present disclosure. The description of the loading apparatus in the embodiments of the loading apparatus also applies to the loading apparatus in the embodiments of the PVD apparatus. Thus, the description of the loading apparatus may be omitted under certain circumstances. In addition, the description of the loading apparatus in the embodiments of the PVD apparatus also applies to the loading apparatus in the embodiments of the loading apparatus.

Figure 6:
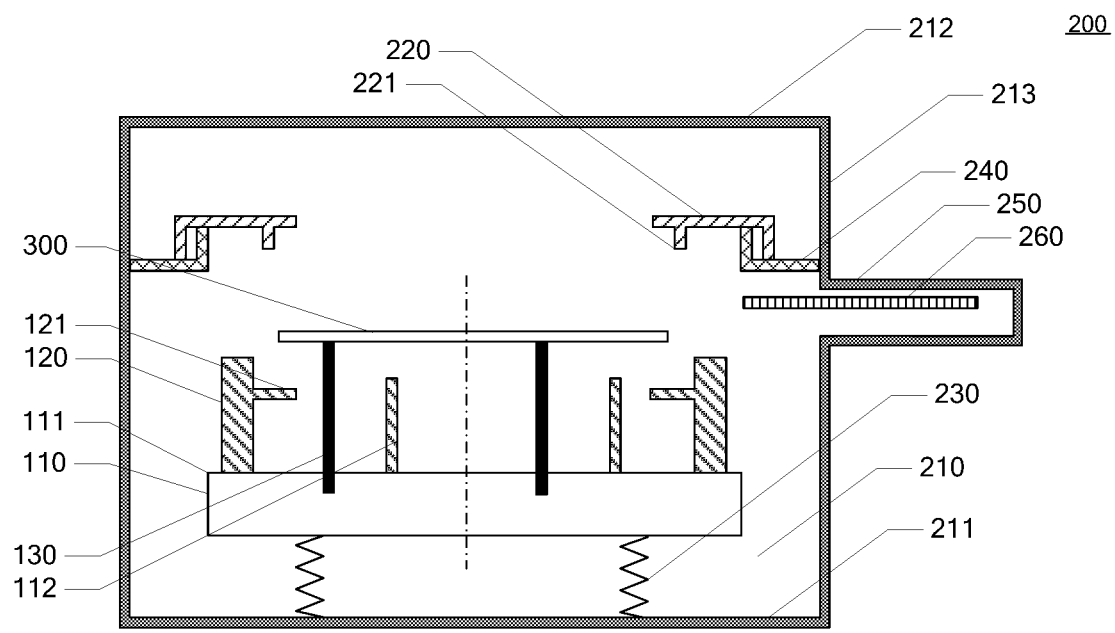
FIG. 6 illustrates a cross-sectional view of an exemplary PVD apparatus according to some embodiments of the present disclosure.

FIG. 6 illustrates a cross-sectional view of an exemplary PVD apparatus according to some embodiments of the present disclosure. The PVD apparatus 200 includes a chamber 210 and a loading apparatus 100 disclosed in the embodiments of the loading apparatus. For example, the chamber 210 includes a bottom wall 211 and a top wall 212 facing toward each other, and a side wall 213 disposed between the bottom wall 211 and the top wall 212. The side wall 213 is coupled to the bottom wall 211 and the top wall 212, respectively. The loading apparatus 100 is disposed between the bottom wall 211 and the top wall 212, and the first support member 120 is disposed opposite to the top wall 212.

In one embodiment, the loading apparatus 100 can move in the axial direction of the pedestal 110 relative to the bottom wall 211 of the chamber 210. When the loading apparatus 100 moves upward, the second support member 112 supports the workpiece 300 and the first support member 120 supports the cover ring 220. Position relationships between the loading apparatus 100 and other components at different stages of the upward movement are described below with reference to FIGS. 6-9, respectively.

In one embodiment, a side of the top wall 212 facing toward the bottom wall 211 may include a target and/or other components. For the convenience of description, all together are simply described as the top wall in the specification. During the deposition process, the loading apparatus ascends and raises the workpiece to a suitable position close to the top wall 212 for the deposition.

In one embodiment, as shown in FIG. 6, the loading apparatus may be coupled to the bottom wall 211 of the chamber 210 by a lifting mechanism 230 (e.g., a bellows), such that the lifting mechanism 230 may drive the loading apparatus to move inside the chamber to various positions required for different stages. For example, the lifting mechanism 230 drives the loading apparatus to move upward in the axial direction of the pedestal. However, the embodiments of the present disclosure are not limited by this example. Other suitable lifting mechanisms may be used to drive the loading apparatus to move upward.

As shown in FIG. 6, in some embodiments, the PVD apparatus 200 includes the cover ring 220. The cover ring 220 is disposed between the loading apparatus and the top wall 212 of the chamber 210. In the axial direction of the pedestal, at least a portion of the cover ring 220 faces toward the top end of the first support member 120.

In the PVD apparatus provided by the embodiments of the present disclosure, the first support member 120 is configured to push up the cover ring 220, is installed on the pedestal, and is fixed at a certain height relative to the second support member 112 supporting the workpiece 300. For example, in some embodiments, according to the high-temperature requirement and the high-vacuum requirement, the materials of the first support member 120 and the cover ring 220 may be selected by considering factors such as vacuum deflation, high temperature resisting strength, high temperature deformation, and saturated vapor pressure. For example, the first support member 120 and the cover ring 220 may be made of a metallic material such as a molybdenum, a high temperature resistant alloy, or a non-metallic material such as ceramic. However, the embodiments of the present disclosure are not limited by these examples. The first support member and the cover ring may be made of any suitable material.

In some embodiments, when the pedestal moves in the axial direction toward the top wall, and the first support member contacts with the cover ring and pushes up the cover ring, a distance between the lower surface of the inner portion of the cover ring and the support surface of the pedestal is greater than a distance between the top end of the second support member and the support surface of the pedestal.

In some embodiments, a difference between the distance between the lower surface of the inner portion of the cover ring and the support surface of the pedestal and the distance between the top end of the second support member and the support surface of the pedestal is greater than a thickness of the workpiece to be processed by the PVD apparatus. That is, the difference between the distance between the lower surface of the inner portion of the cover ring and the support surface of the pedestal and the distance between the top end of the second support member and the support surface of the pedestal is greater than the thickness of the workpiece to be processed by the PVD apparatus. In this structure, when the workpiece is placed on the second support member, the lower surface of the inner portion of the cover ring is still higher than the upper surface of the workpiece.

In some embodiments, as shown in FIG. 6, the PVD apparatus also includes a shield 240. The shield 240 surrounds at least a portion of the side wall of the chamber and is coupled with the side wall. When the pedestal 110 is at a detached position, that is, when the cover ring 220 is not supported by the first support member 120, that is, before the first support member 120 pushes up the cover ring 220, the shield 240 supports the cover ring 220. It should be understood by those skilled in the art that the shield 240 may be an annular-shaped structure and may have a shape and a corresponding size capable of supporting the cover ring 220. Those skilled in the art may select any suitable shape and size according to actual requirements, which are not limited by the embodiments of the present disclosure.

In addition, as shown in FIG. 6, in some embodiments, the PVD apparatus also includes a shutter storage 250 and a shutter 260. The shutter 260 may be stored in the shutter storage 250. The shutter storage 250 is coupled with a portion of the side wall of the chamber 210, and is connected to the inside of the chamber 210. Further, a valve or the like may be disposed between the shutter storage 250 and the chamber 210, which is not limited by the embodiments of the present disclosure.

During the movement of the pedestal, the pedestal may pass various positions. The PVD apparatus provided by the embodiments of the present disclosure will be described in more detail below with reference to the pedestal at different stages.

In some embodiments, as shown in FIG. 6, the top end of the liftable support pin 130 ascends above the second support member 112. At this point, the liftable support pin 130 supports the workpiece 300. The robotic arm may transfer the workpiece 300 to the support pin 130. For example, when the support pin 130 is at its highest position, the top end of the support pin 130 may be higher than the top ends of the first support member 120 and the second support member 112. As such, when the robotic arm performs the transfer operation, the movement of the robotic arm is not obstructed.

Figure 7:
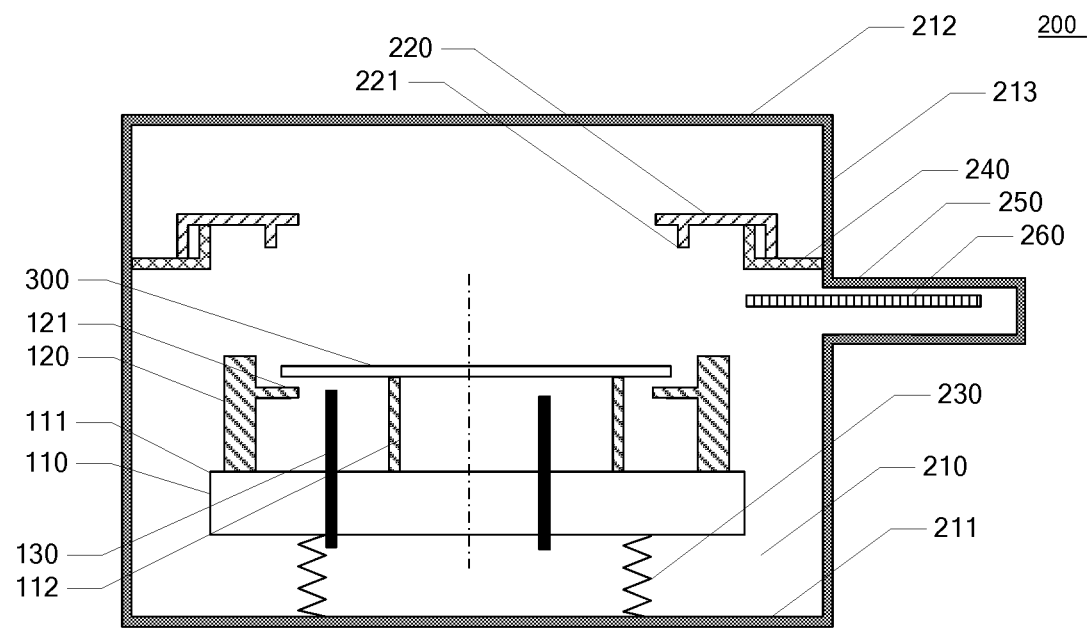
FIG. 7 illustrates a cross-sectional view of another exemplary PVD apparatus according to some embodiments of the present disclosure.

Then, as shown in FIG. 7, the liftable support pin 130 descends. When the top end of the support pin 130 is at a same level with the top end of the second support member 112, the workpiece 300 contacts with the second support member 112. As the support pin 130 continues to descend, the support pin 130 is disengaged with the workpiece 300, and the workpiece 300 is placed on the second support member 112.

In some embodiments, after the support pin 130 places the workpiece 300 on the second support member 112, the workpiece 300 may not contact the first support member 120. In some embodiments, referring to FIG. 3A and FIG. 3B, the first support member 120 may be the annular-shaped structure. The first support member 120 includes an extension portion 121 extending inward. The inner diameter A of the extension portion 121 is smaller than the outer diameter B of the workpiece 300. (B−A)/2 is a width d of the gap between the first support member 120 and the workpiece 300. The upper surface of the extension portion 121 (i.e., the surface of the first support member 120 directly facing toward to the workpiece 300) is lower than the top end of the second support member 112, the size in-between is f. As described in the loading apparatus embodiments, the width d and the size f may satisfy a ratio relationship for effectively blocking the plasma, which will not be repeated herein.

Both FIG. 6 and FIG. 7 illustrate cross-sectional views of the chamber before the process is performed. Before the process is performed in the chamber, the cover ring 220 is placed on the shield 240. At this point, the robotic arm is used to place workpiece 300 on the liftable support pin 130. Then, the liftable support pin 130 descends to place the workpiece 300 on the second support member 112. At this point, the pedestal is under the cover ring 220 and does not contact the cover ring 220. In addition, the liftable support pin 130 descends relative to the pedestal. Either the support pin 130 descends or other structures of the pedestal ascends while the support pin 130 stays at the same position. In addition, the driving mechanism of the support pin 130 may be disposed inside the pedestal or may be disposed outside the pedestal, which is not limited the present disclosure.

In addition, FIG. 3A illustrates the cross-sectional view of the workpiece 300 supported by the second support member 112. In some embodiments, after the workpiece 300 is placed on the second support member 112, the extension portion 121 and the portion of the workpiece 300 overlapping with the extension portion 121 may form a gap or may exactly contact each other. For example, in case of having the gap, the size of the gap in the axial direction of the pedestal may be 1 mm or less, and the size (in the radial direction) of the overlapping portion in the horizontal direction (in the direction of the support surface) is 6 mm or more. However, the sizes are for illustrative purposes. The sizes f and d need to satisfy a ratio range as described in the embodiments of the loading apparatus. The design of the gap sizes may prevent the plasma and the deposition material from passing through the gap.

Figure 8:
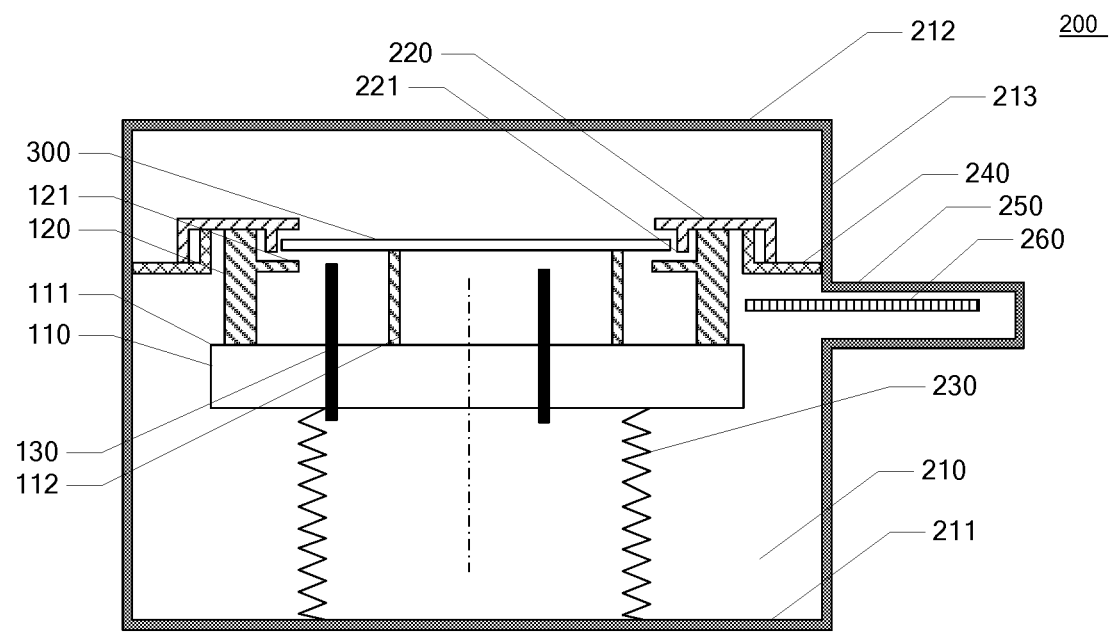
FIG. 8 illustrates a cross-sectional view of another exemplary PVD apparatus according to some embodiments of the present disclosure.

As shown in FIG. 8, the pedestal continues to ascend until the top end of the first support first support member 112 contacts with the cover ring 220. At this point, depending on the size restriction, the lower surface of at least a portion (the inner portion) of the cover ring 220 overlapping with the workpiece 300 does not contact the upper surface of the workpiece 300. The weight of the cover ring 220 is supported by the first support member 120. At this point, the workpiece 300, the first support member 120, and the cover ring 220 have a fixed relative position with each other. The entire workpiece 300 only contacts with the second support member 112 on the pedestal. The external forces that the workpiece 300 is subject to include a gravitational force of itself and a support force of the second support member 112. The weight of the cover ring 220 is supported by the first support member 120. As such, the external forces that the workpiece 300 is subject to are reduced, and the risk of breaking the workpiece 300 is minimized.

Figure 9:
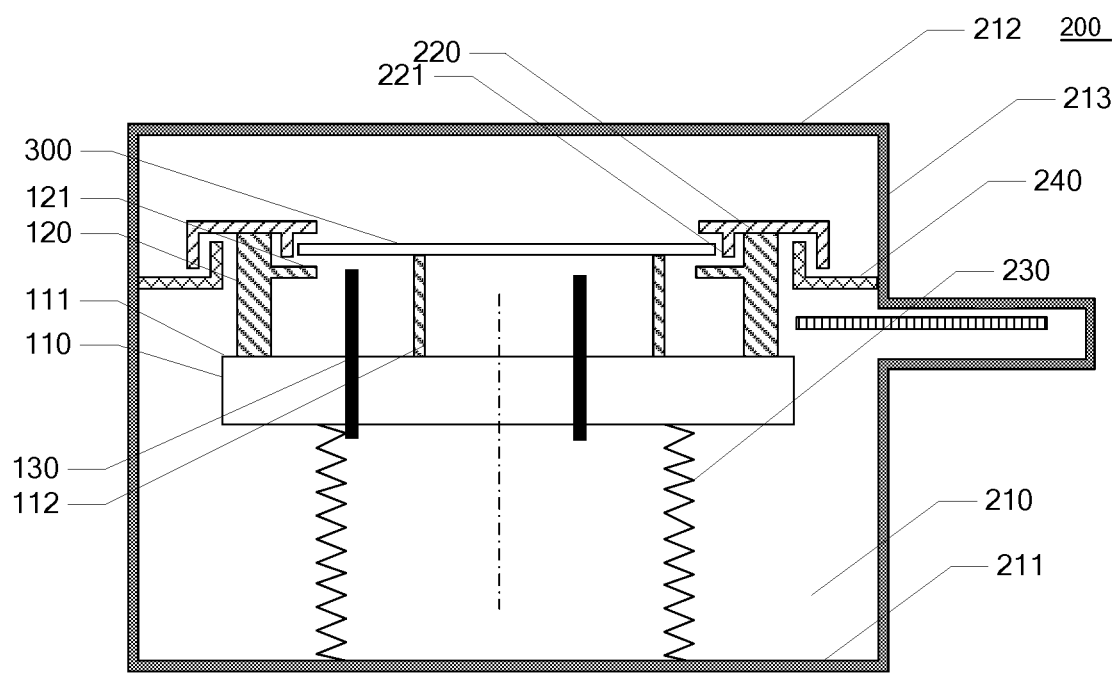
FIG. 9 illustrates a cross-sectional view of another exemplary PVD apparatus according to some embodiments of the present disclosure.

As shown in FIG. 9, after the cover ring 220 contacts with the first support member 120, the cover ring 220 continues to be pushed up and separated from the shield 240 by a certain distance as the pedestal continues to ascend. At this point, the workpiece 300, the cover ring 220, the side wall 213, and the top wall 212 together form an enclosed space for producing the plasma and depositing the thin film on the workpiece 300. The operation position described in the embodiments of the present disclosure refers to the current position. The cross-sectional view in FIG. 9 illustrates the position relationship between the workpiece 300, the first support member 120, and the cover ring 220. In one embodiment, as shown in FIG. 9, the top end of the first support member 120 is higher than the top end of the second support member 112 supporting the workpiece 300 and the height difference is greater than the thickness of the workpiece 300. As such, after the workpiece 300 is placed on the second support member 112, the top end of the first support member 120 is still higher than the upper surface of the workpiece 300. At this point, the first support member 120 contacts with the cover ring 220, such that the cover ring 220 does not contact the workpiece 300.

Although the workpiece 300 does not contact the cover ring 220, the gaps formed between the upper surface of the periphery portion of the workpiece 300, the lower surface of the periphery portion of the workpiece 300, the cover ring and the support members prevent the plasma from entirely passing through the gaps to deposit on the components such as a heating element inside the pedestal directly under the lower surface of the workpiece 300, thereby achieving the sealing of the plasma.

However, because the gap between the upper surface of the workpiece 300 and the lower surface of the cover ring 220 has a substantially large ratio of the size in the radial direction over the size in the axial direction, the gap itself may practically satisfy the requirement for blocking the plasma. Thus, the extension portion 121 of the first support member 120 may not be necessary, the extension portion 12 may be removed or may not form a straight gap with the workpiece. In addition, in some embodiments, the first support member 120 may not be an enclosed annular-shaped structure. Instead, the first support member 120 may include a plurality of discrete first support sub-members (as shown in FIG. 4).

In one embodiment, as shown in FIG. 9, the top end of the first support member 120 is higher than the top end of the second support member 112. Thus, when pushing up the cover ring 220, the first support member 120 may not contact the workpiece 300. However, the embodiments of the present disclosure are not limited by the example. For example, the top end of the first support member 120 may also be lower than the top end of the cover ring 220. At this point, to avoid contacting with the workpiece 300 by the inner portion of the cover ring 220, the lower surface of the cover ring 220 facing toward the first support member 120 may include a downward protrusion. The protrusion may contact the top end of the first support member 120 and may be supported by the first support member 120. Thus, as long as the cover ring 220 does not contact the workpiece 300, the portion in contact between the first support member 120 and the cover ring 220 may be in a form of any suitable structure.

In addition, because the cover ring 220 is pushed up by the first support member 120 and separated from the shield 240, the gap between the cover ring 220 and the shield 240 may also satisfy the condition that the ratio of the gap length over the gap height is greater than 5. As shown in FIG. 9, the lower surface of the cover ring 220 and the inner surface of the downward protrusion in the periphery of the cover ring 220 together may form a gap with the top end and the outer surface of the shield 240. However, the embodiments of the present disclosure are not limited by the example. Other suitable structures may be configured to prevent the plasma from leaking.

The loading apparatus and the PVD apparatus including the loading apparatus provided by the embodiments of the present disclosure reduce the stress forces on the workpiece by external components. The workpiece is only subject to the gravitational force and the support force by the second support member to balance the gravitational force. In addition, because the workpiece does not contact the cover ring, the bonding that is likely to occur between the workpiece and the cover ring is avoided, thereby reducing the chances that the workpiece breaks, or the workpiece is placed at an uncertain or undesired position. In addition, the plasma is effectively prevented from passing through the workpiece and being sputtered onto the upper surface of the pedestal.

The following points should be noted.

(1) Only the structures disclosed in the embodiments of the present disclosure are illustrated in the drawings of the present disclosure. Other structures may be referred to general designs.

(2) The features of the same embodiment and different embodiments of the present disclosure may be combined with each other under the circumstances of no conflict.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure, which is determined by the appended claims.

What is claimed is:

1. A loading apparatus, comprising:
   a pedestal configured to support a workpiece and including a support surface;
   a first support member placed on the support surface and configured to push up a cover ring when the pedestal is at an operation position to prevent an overlapping portion of a cover ring and the workpiece from contacting each other; and
   a second support member placed on the support surface and configured to support the workpiece;
   wherein the first support member and the second support member are separate pieces placed on the support surface that is on a same plane perpendicular to an axial direction of the pedestal, the first support member having a height greater than the second support member.

2. The loading apparatus according to claim 1, wherein:
   the first support member is an annular-shaped structure annularly placed on the support surface of the pedestal.

3. The loading apparatus according to claim 2, wherein:
the annular-shaped structure includes at least one avoidance opening to allow a workpiece transferring mechanism to pass through; and
the workpiece is placed on the pedestal by the workpiece transferring mechanism.

4. The loading apparatus according to claim 1, wherein:
the first support member includes a plurality of first support sub-members evenly distributed along a circumference of the pedestal; and
each of the plurality of first support sub-members pushes up the cover ring when the pedestal is at the operation position.

5. The loading apparatus according to claim 1, wherein:
the first support member further includes an extension portion extending from an inner surface of the first support member to the center of the pedestal until overlapping with the workpiece; and
when the pedestal is at the operation position, in the axial direction of the pedestal, an upper surface of the extension portion overlapping with the workpiece is lower than a lower surface of the workpiece or directly contacts the lower surface of the workpiece.

6. The loading apparatus according to claim 5, wherein:
in a radial direction of the pedestal, a gap is formed between at least the portion of the first support member located above the extension portion and the workpiece.

7. The loading apparatus according to claim 5, wherein:
in the axial direction of the pedestal, a first gap is formed between the lower surface of the workpiece and the extension portion; and
a ratio of a radial length of an orthogonal projection of the first gap on the pedestal over a height of the first gap is greater than 5.

8. The loading apparatus according to claim 1, wherein:
in the axial direction of the pedestal, a second gap is formed between an upper surface of the workpiece and the cover ring; and
a ratio of a radial length of an orthogonal projection of the second gap on the pedestal over a height of the second gap is greater than 5.

9. The loading apparatus according to claim 1, wherein:
the second support member includes a plurality of second support sub-members; and
at least one of the plurality of second support sub-members is a thermocouple.

10. A physical vapor deposition (PVD) apparatus, comprising:
a chamber including a bottom wall, a top wall disposed opposite to the bottom wall, and a side wall disposed between the top wall and the bottom wall and coupled with the top wall and the bottom wall; and
a loading apparatus disposed between the bottom wall and the top wall and including:
a pedestal configured to support a workpiece and including a support surface;
a first support member placed on the support surface opposite to the top wall and configured to prevent an overlapping portion of a cover ring and the workpiece from contacting each other when the pedestal ascends to an operation position and pushes up the cover ring; and
a second support member placed on the support surface and configured to support the workpiece;
wherein the first support member and the second support member are separate pieces placed on the support surface that is on a same plane perpendicular to an axial direction of the pedestal, the first support member having a height greater than the second support member.

11. The PVD apparatus of claim 10, further including a shield, wherein:
the shield surrounds at least a portion of the side wall of the chamber and is coupled with the side wall of the chamber; and
when the pedestal is at a detached position, the shield supports the cover ring.

12. The PVD apparatus of claim 10, wherein:
the first support member is an annular-shaped structure annularly placed on the support surface of the pedestal.

13. The PVD apparatus of claim 12, wherein:
the annular-shaped structure includes at least one avoidance opening to allow a workpiece transferring mechanism to pass through; and
the workpiece is placed on the pedestal by the workpiece transferring mechanism.

14. The PVD apparatus of claim 10, wherein:
the first support member includes a plurality of first support sub-members evenly distributed along a circumference of the pedestal; and
each of the plurality of first support sub-members pushes up the cover ring when the pedestal is at the operation position.

15. The PVD apparatus of claim 10, wherein:
the first support member further includes an extension portion extending from an inner surface of the first support member to the center of the pedestal until overlapping with the workpiece; and
when the pedestal is at the operation position, in the axial direction of the pedestal, an upper surface of the extension portion overlapping with the workpiece is lower than a lower surface of the workpiece or directly contacts the lower surface of the workpiece.

16. The PVD apparatus of claim 15, wherein:
in a radial direction of the pedestal, a gap is formed between at least the portion of the first support member located above the extension portion and the workpiece.

17. The PVD apparatus of claim 10, wherein:
in the axial direction of the pedestal, a first gap is formed between the lower surface of the workpiece and the extension portion; and
a ratio of a radial length of an orthogonal projection of the first gap on the pedestal over a height of the first gap is greater than 5.

18. The PVD apparatus of claim 10, wherein:
in the axial direction of the pedestal, a second gap is formed between an upper surface of the workpiece and the cover ring; and
a ratio of a radial length of an orthogonal projection of the second gap on the pedestal over a height of the second gap is greater than 5.

* * * * *